United States Patent
Koh et al.

(10) Patent No.: US 7,387,869 B2
(45) Date of Patent: Jun. 17, 2008

(54) METHOD OF FORMING PATTERN FOR SEMICONDUCTOR DEVICE

(75) Inventors: Cha-Won Koh, Yongin-si (KR); Sang-Gyun Woo, Yongin-si (KR); Byeong-Soo Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 463 days.

(21) Appl. No.: 11/137,451

(22) Filed: May 26, 2005

(65) Prior Publication Data

US 2005/0266356 A1    Dec. 1, 2005

(30) Foreign Application Priority Data

May 27, 2004    (KR)    .................... 10-2004-0037811

(51) Int. Cl.
*G03F 7/20* (2006.01)
*G03F 7/26* (2006.01)
(52) U.S. Cl. ................. 430/313; 430/322; 430/311; 430/323
(58) Field of Classification Search ............. 430/311, 430/313, 314, 323
See application file for complete search history.

(56) References Cited

U.S. PATENT DOCUMENTS

| 6,316,168 | B1 * | 11/2001 | Butt et al. ................. 430/314 |
| 6,379,869 | B1 * | 4/2002 | Schroeder et al. ........... 430/313 |
| 2004/0033445 | A1 | 2/2004 | Lee et al. |
| 2005/0164478 | A1 * | 7/2005 | Chan et al. ................. 438/585 |

FOREIGN PATENT DOCUMENTS

| JP | 2000-315684 | | 11/2000 |
| KR | 1020000071655 | | 11/2000 |
| KR | 1020000071655 | A | 11/2000 |
| KR | 1020010026007 | A | 4/2001 |
| KR | 1020040015955 | A | 2/2004 |

* cited by examiner

*Primary Examiner*—Mark F. Huff
*Assistant Examiner*—Brittany Raymond
(74) *Attorney, Agent, or Firm*—Volentine & Whitt, PLLC

(57) ABSTRACT

A method of forming a pattern for a semiconductor device is disclosed. According to the method, a lower photoresist layer is formed on a lower layer and an upper photoresist pattern including a silylated layer is formed on the lower photoresist layer. The upper photoresist pattern is used as a mask for etching the lower photoresist layer to thereby form a lower photoresist pattern. The upper and lower photoresist patterns are used as a mask for etching the lower layer beneath the lower photoresist pattern.

17 Claims, 4 Drawing Sheets

METHOD OF FORMING PATTERN FOR SEMICONDUCTOR DEVICE

BACKGROUND OF THE INVENTION

1. Field of the Invention

The present invention relates generally to a method of fabricating a semiconductor device, and more particularly to a method of forming a pattern in a semiconductor device using a photolithographic process.

A claim of priority is made to Korean Patent Application No. 2004-37811 filed on May 27, 2004, the disclosure of which is hereby incorporated by reference in its entirety.

2. Description of the Related Art

Photolithographic processes are commonly used to create patterns in semiconductor devices. These patterns include, for example, trenches used to form circuits. In order to create smaller, higher performance semiconductor devices, methods for forming smaller patterns in the semiconductor devices are generally needed.

Patterns are typically formed in semiconductor devices by forming a photoresist pattern on a semiconductor substrate using a photomask and then etching the semiconductor substrate using the photoresist pattern as an etching mask. In other words, the photoresist pattern generally defines the patterns to be formed in the semiconductor substrate.

The photoresist pattern is generally formed by a thin photoresist layer to ensure that an exposure margin is large enough for the photoresist pattern to be precisely formed. Unfortunately, however, a thin photoresist pattern is generally susceptible to being etched during etching of the semiconductor substrate, thereby distorting the photoresist pattern. In addition, in the event that the semiconductor substrate contains silicon, silicon byproducts are often produced on the photoresist pattern, providing another source of distortion for the photoresist patterns. In cases where a highly precise pattern is needed for a semiconductor device, such distortion of the photoresist patterns is unacceptable.

Various efforts have been made to effectively address the distortion problems described above. For example, methods adapted to prevent distortion in photoresist patterns are disclosed in Korean Patent Applications Nos. 2000-71655 and No. 2001-26007.

A conventional method of forming a pattern in a semiconductor device 10 will now be described with reference to FIGS. 1 through 4.

Referring to FIG. 1, a lower layer 14 is formed on a semiconductor substrate 12. An upper layer 16 is formed on lower layer 14. Lower layer 14 is used as an anti-reflecting coating (ARC) film, and upper layer 16 is made of photoresist. Using a photolithographic process such as exposure and development, upper layer 16 is etched to form a pattern having openings 20 exposing lower layer 14. Using an ion implantation process involving silicon ions, a silylated layer 22 is formed on a top surface of upper layer 16 and on portions of lower layer 14 exposed through openings 20. The silicon ions are introduced by an ion implantation process rather than virtual silylation to ensure that portions of silylated layer 22 formed on lower layer 14 are formed only on exposed areas, thereby preventing a bird's beak from forming in lateral regions of openings 20. This enables images of openings 20 to be accurately copied to lower layers.

Referring to FIG. 2, upper layer 16 is removed to expose a surface 24 of lower layer 14 between remaining portions of silylated layer 22.

Referring to FIG. 3, lower layer 14 is ashed using oxygen plasma. Since silicon ions used to form silylated layer 22 react with oxygen ions to form an oxide layer, lower layer 14 is not etched beneath remaining portions of silylated layer 22. Thus, the image of the remaining portions of silylated layer 22 is copied to lower layer 14.

Referring to FIG. 4, lower layer 14 is ashed to etch exposed portions of substrate 12. The remaining portions of silylated layer 22 and lower layer 14 act as an etch-stop layer in the ashing process. Once substrate 12 is etched, the remaining portions of silylated layer 22 are removed, leaving only the remaining portions of lower layer 14 on substrate 12. The remaining portions of lower layer 14 constitute pattern elements 26 for semiconductor device 10.

According to the method described above, after forming silylated layer 22 on upper layer 16 and lower layer 14, upper layer 16 and portions of silylated layer 22 formed on upper layer 16 are removed while lower layer 14 and portions of silylated layer 22 formed on lower layer 14 are not removed. In order for this to occur, upper layer 16 must be isotropically removed using etchants that do not remove silylated layer 22. Among these etchants, those having a low etch rate with respect to lower layer 14 are generally used. Otherwise, where even a small amount of lower layer 14 is removed during the removal of upper layer 16, smaller portions of silylated layer 22 remaining on lower layer 14 may be wholly or partially separated therefrom, thus making the method somewhat unpredictable.

Because the conventional method of forming patterns in a semiconductor device does not use virtual silylation, a bird's beak does not form when silylated layer 22 is formed. Because lower layer 14 may be partially removed, however, the method is still somewhat unpredictable.

SUMMARY OF THE INVENTION

The present invention provides a method of forming a pattern for a semiconductor device. The method can be applied to processes for fabricating semiconductor devices as well as processes for forming a reticle used to copy images to a substrate.

According to one embodiment of the present invention, a lower layer is formed on a substrate, a lower photoresist layer is formed on the lower layer, and an upper photoresist pattern including a silylated layer is formed on the lower photoresist layer. The silylated layer is oxidized using oxygen plasma and simultaneously the lower photoresist layer is anisotropically ashed to form a lower photoresist pattern. The lower layer is etched using the upper and lower photoresist patterns as a mask.

According to another embodiment of the present invention, a lower layer is formed on a substrate, a lower photoresist layer is formed on the lower layer, and an upper photoresist pattern having an opening exposing the lower photoresist layer is formed on the lower photoresist layer. Silicon ions are directionally introduced to the upper photoresist pattern to form a silylated layer and the silylated layer is oxidized using oxygen plasma. At the same time that the silylated layer is oxidized using oxygen plasma, the lower photoresist layer exposed by the opening is anisotropically ashed to form a lower photoresist pattern. The lower layer is then etched using the upper and lower photoresist patterns as a mask.

BRIEF DESCRIPTION OF THE DRAWINGS

The invention is described with reference to several embodiments illustrated in the accompanying drawings. Throughout the drawings like reference numbers indicate like exemplary elements, components, or steps. In addition, the thickness of regions and layers is exaggerated for clarity. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow. In the description it will be understood that where a layer is described as being "on" or "onto" another layer, the layers may be directly in contact with each other, or intervening layers may also be present.

Figure 1:
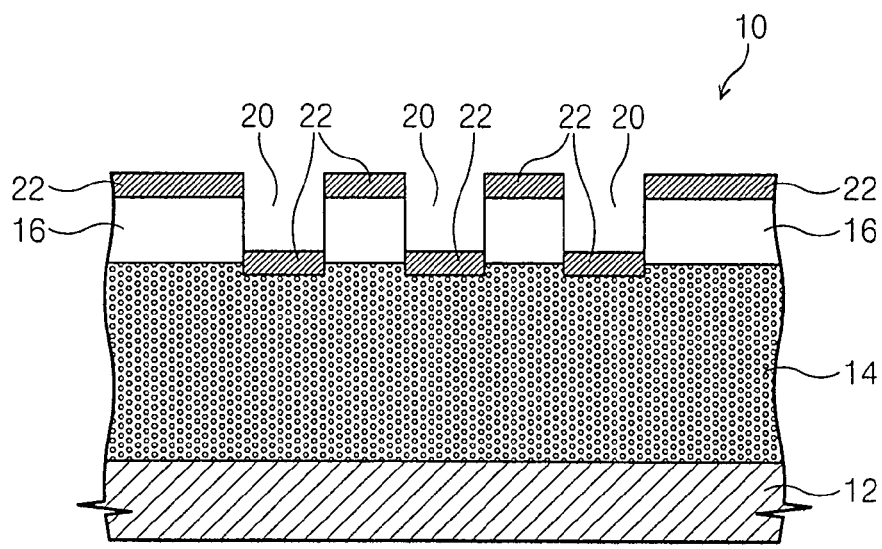
FIGS. 1 through 4 illustrate a conventional method of forming patterns in a semiconductor device; and, FIGS. 5 through 10 illustrate a method of forming patterns in a semiconductor device according to the present invention.
Figure 2:
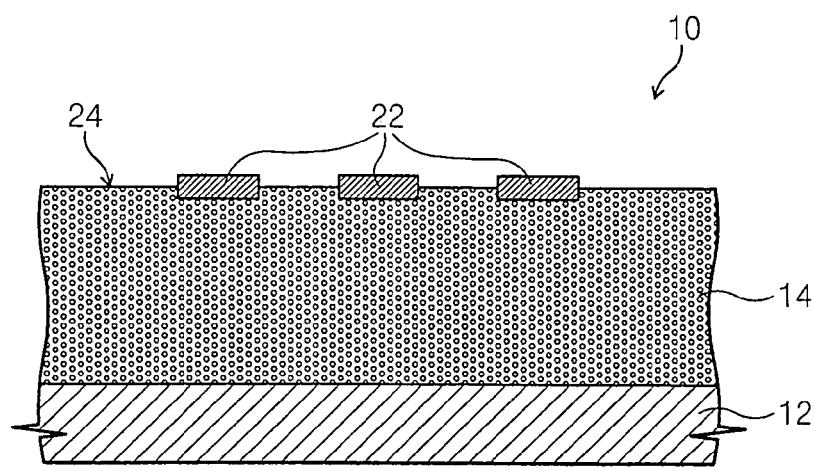
Figure 3:
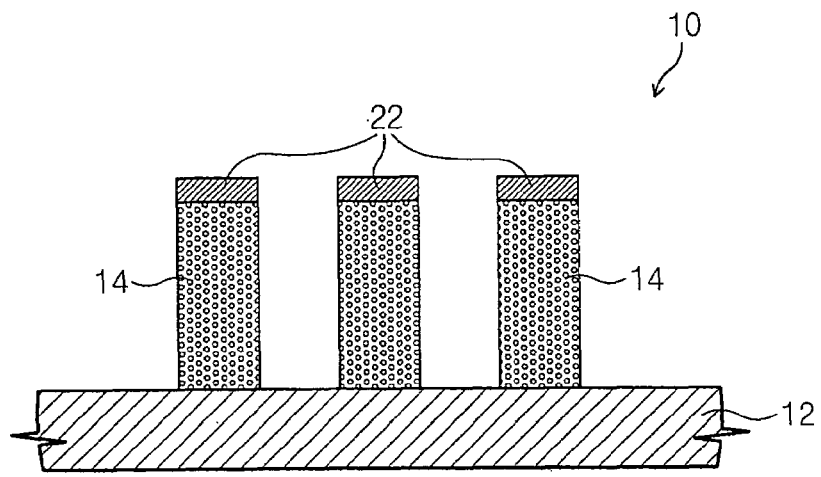
Figure 4:
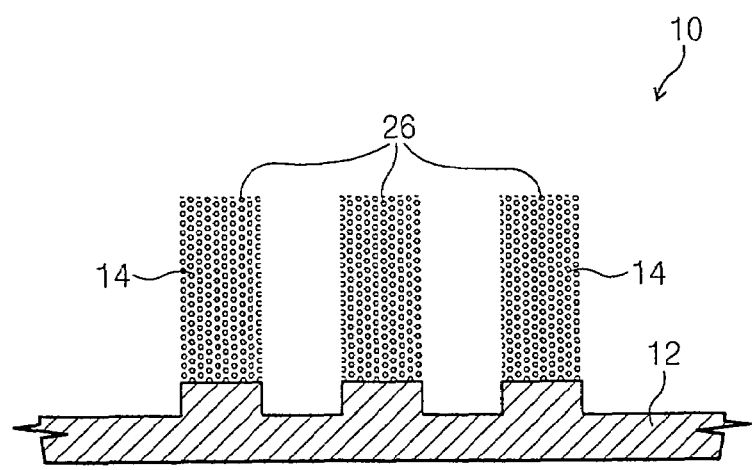
Figure 5:
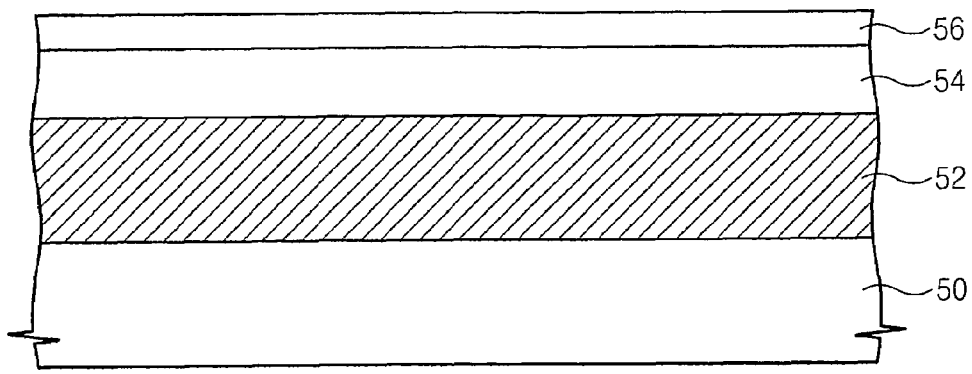

Referring to FIG. 5, a lower layer 52 is formed on a substrate 50. A lower photoresist layer 54 is formed on lower layer 52 and an upper photoresist layer 56 is formed on lower photoresist layer 54. Lower photoresist layer 54 typically comprises an anti-reflecting coating (ARC) film and may act as an etch-stop layer for upper photoresist layer 56. Lower photoresist layer 54 is typically formed to a thickness of at least 1 μm and submitted to a baking process performed at a temperature of 200° C. for 90 seconds. Upper photoresist layer 56 is typically formed to a thickness of 0.41 μm or less and then submitted to a baking process performed at a temperature of 90° C. for 90 seconds. Upper photoresist layer 56 usually has a small thickness to enhance a depth of focus (DOF) margin and to accurately copy a fine pattern.

Figure 6:
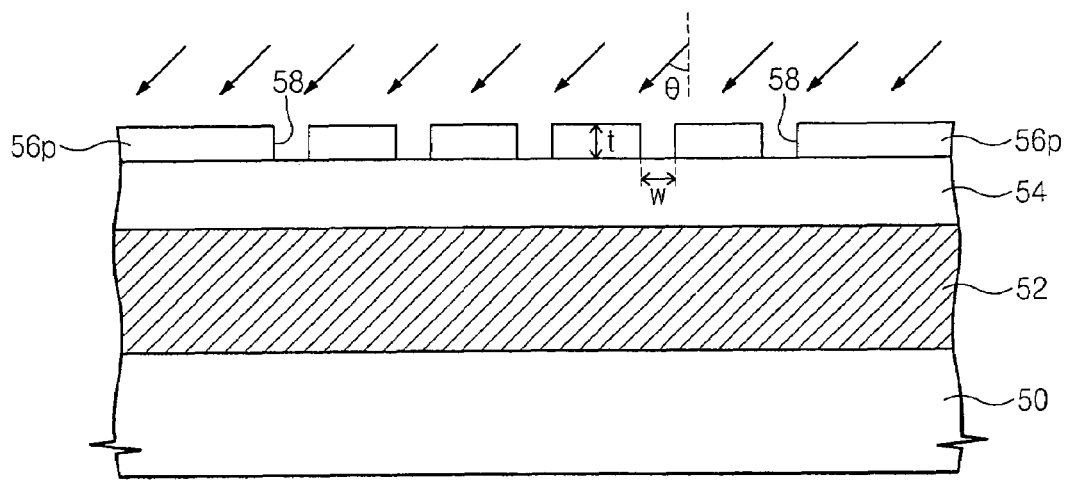

Referring to FIG. 6, upper photoresist layer 56 is exposed to light having a wavelength of about 248 nm. Exposed upper photoresist layer 56 is baked at a temperature of 100° C. for 90 seconds. Baked upper photoresist layer 56 is developed using 2.38% tetramethylammonium hydroxide (TMAH) to form an upper photoresist pattern 56p. Conditions used to form upper photoresist pattern 56p generally vary according to the type and thickness of the photoresist used and parameters related to the light source used in the exposure process.

Upper photoresist pattern 56p has openings 58 exposing lower photoresist layer 54. The thickness of upper photoresist layer 56 is generally large enough relative to the diameter or linewidth of openings 58 so that the aspect ratio (i.e. width vs. height) of the openings is not high.

Silicon ions are directionally introduced to upper photoresist pattern 56p. The introduction of the silicon ions is generally done using an oblique ion implantation process with a projection angle θ. The energy of the injected ions varies according to the type and thickness the photoresist in upper photoresist layer 56. Silicon ions are typically introduced with a dosage of about $1.0 \times 10^{15} \sim 10 \times 10^{17}$ Si/cm². Projection angle θ is chosen such that the silicon ions are only introduced to upper photoresist pattern 56p and not to portions of lower photoresist layer 54 exposed through openings 58.

Projection angle θ is chosen according to the following constraint to ensure that silicon ions do not reach portions of lower photoresist layer 54 exposed through openings 58:

$\arctan(\max(w/t)) < \theta < 2\pi;$ where 'w' represents a width of openings 58; 't' represents a thickness of upper photoresist pattern 56; and, 'max(w/t)' represents a maximum value for w/t, i.e., a maximum aspect ratio taken across openings 58.

Figure 7:
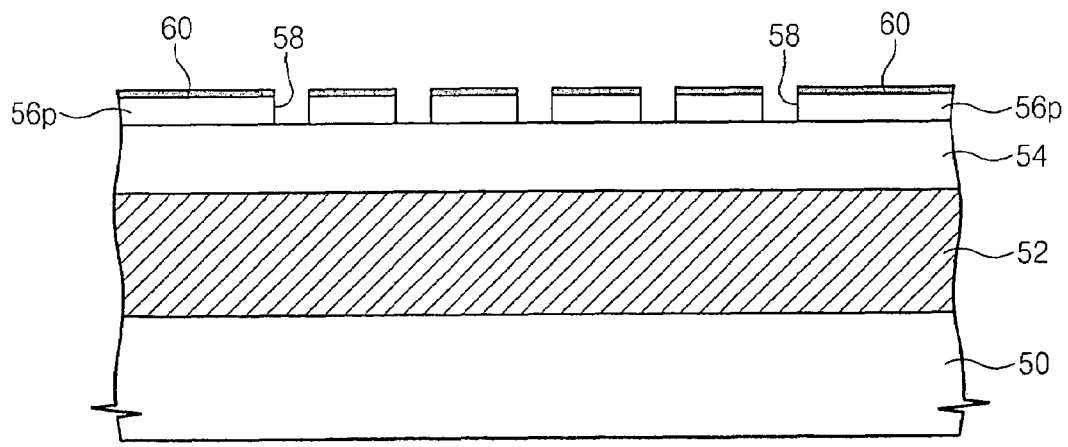

In the ion implantation process, a silicon source containing only silicon ions may be introduced to upper photoresist pattern 56p or a silicon source such as silicon tetrafluoride $SiF_4$ gas may be used to introduce the silicon ions. As a result of the ion implantation process, a silylated layer 60 is formed on upper photoresist pattern 56p, as shown in FIG. 7.

Figure 8:
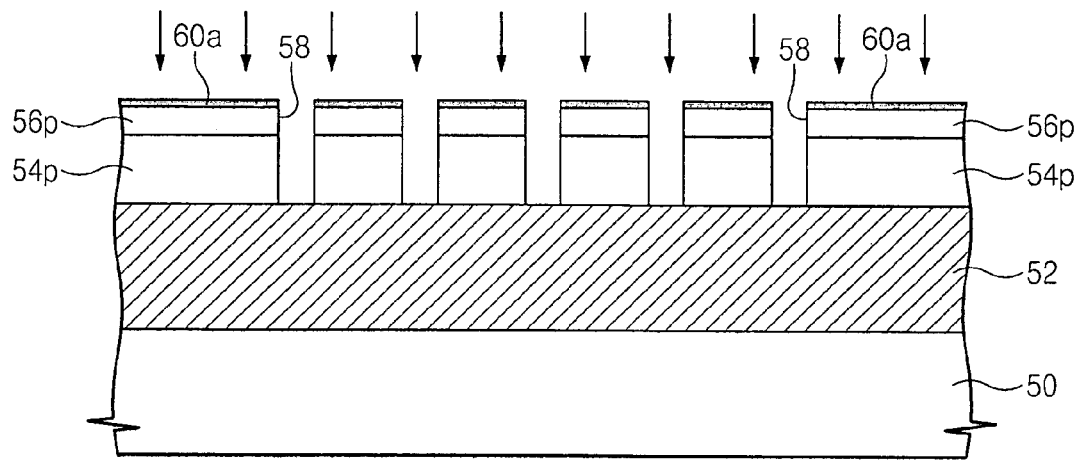

Referring to FIG. 8, using photoresist pattern 56p and silylated layer 60 as a mask, lower photoresist layer 54 is ashed using oxygen plasma. In some cases, the oxygen profile of the oxygen plasma may be improved by adding an inert gas such as argon (Ar), helium (He), or nitrogen ($N_2$) plasma thereto. Because the oxygen reacts with the silicon in silylated layer 60, silylated layer 60 is converted into an oxide layer 60a. During the ashing process used to ash lower photoresist layer 54, upper photoresist pattern 56p is prevented from being ashed by silylated layer 60. As a result of the ashing process, a lower photoresist pattern 54p aligned to upper photoresist pattern 56p and having an opening exposing lower layer 52 is formed.

Figure 9:
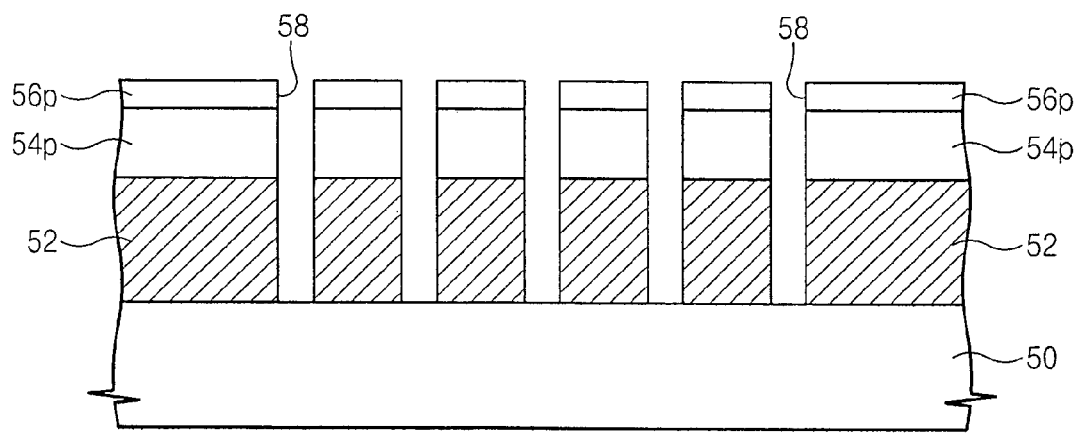

Referring to FIG. 9, using upper and lower photoresist patterns 56p and 54p as a mask, lower layer 52 is etched. Since the thickness of lower photoresist layer 54 is not restricted by a margin of DOF, lower photoresist pattern 54p may have a relatively large thickness compared to upper photoresist pattern 56p. Hence, photoresist pattern 54p provides a large etch barrier even where a large amount of lower layer 52 is etched. In cases where lower layer 52 is made of a material selected from a silicon-oxide series, silylated layer 60 may be etched while etching lower layer 52. Even where lower layer 52 is made of a silicon-containing material, however, the top surface of upper photoresist pattern 56p is covered with silylated layer 60 to suppress the formation of silicon glass.

Figure 10:
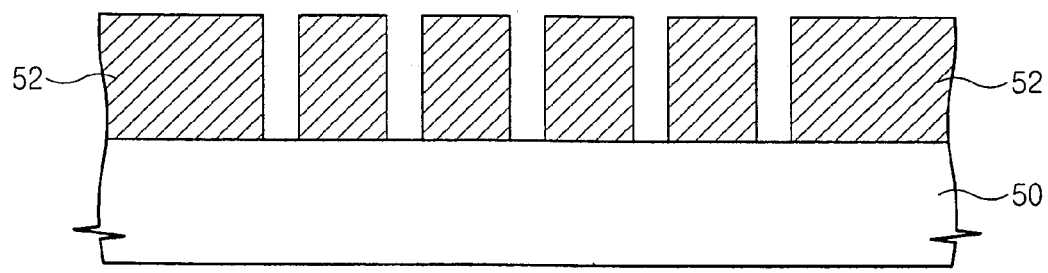

Referring to FIG. 10, upper and lower photoresist patterns 56p and 54p are removed. Typically, they are typically isotropically removed using a stripping solution. Where silylated layer 60 is already removed, upper and lower photoresist patterns 56p and 54p may be removed by oxygen plasma ashing.

The present invention may be applied to processes for fabricating semiconductor devices as well as processes for forming a reticle (e.g. a photomask) used to copy images to a substrate. Moreover, the present invention may be applied to etching processes using photoresist as a mask.

As explained above, after forming an upper photoresist pattern, silicon ions are introduced into upper photoresist pattern 56p in order to form stacked upper and lower photoresist patterns 56p and 54p respectively. Since lower layer 52 is etched using upper photoresist pattern 56p as an etch mask, an additional process is not needed to remove lower photoresist pattern 54p. As a result, there is no requirement to choose a lower photoresist pattern and a stripping solution to selectively remove upper photoresist pattern 56p. Whereas lower photoresist layer 54 is relatively thick so as to provide an etch barrier layer, upper photoresist layer 56 is relatively thin so as to allow fine patterns to be accurately formed even in cases where a large amount of lower layer 52 is etched.

What is claimed:

1. A method of forming a pattern, the method comprising:
    forming a lower layer on a substrate;
    forming a lower photoresist layer on the lower layer;
    forming an upper photoresist pattern on the lower photoresist layer by forming an upper photoresist layer on the lower photoresist layer, patterning the upper photoresist layer to form openings, and thereafter selectively implanting silicon ions in the upper photoresist pattern using a directional implantation process to form a silylated layer only in upper portions of the upper photoresist pattern;

simultaneously oxidizing the silylated layer in an oxygen plasma and anisotropically ashing the lower photoresist layer to form a lower photoresist pattern; and, etching the lower layer using at least one of the upper and lower photoresist patterns as a mask.

2. The method of claim 1, wherein the directional implantation process is an oblique ion implantation process.

3. The method of claim 2, wherein a projection angle θ for the oblique ion implantation process is constrained by the relation arctan(max(w/t))<θ<2π;

wherein 'w' denotes a width of the openings in the upper photoresist pattern;

wherein 't' denotes a thickness of the upper photoresist pattern; and, max(w/t) being a maximum value for w/t taken across the openings.

4. The method of claim 1, wherein forming the upper photoresist pattern further comprises:

exposing the upper photoresist layer to light having a wavelength about 248 nm;

baking the upper photoresist layer at a temperature of about 100° C. for about 90 seconds; and thereafter, developing the upper photoresist layer using 2.38% tetramethylammonium hydroxide (TMAH).

5. The method of claim 1, wherein the lower photoresist pattern is formed to a thickness of at least 1 μm and the upper photoresist pattern is formed to a thickness of 0.4 μm or less.

6. A method of forming a pattern, the method comprising:

forming a lower layer on a substrate;

forming a lower photoresist layer having a first thickness on the lower layer;

forming an upper photoresist layer having a second thickness on the lower photoresist layer, wherein the lower photoresist layer serves as an anti-reflecting coating layer and an etch-stop layer in relation to the upper photoresist layer;

patterning the upper photoresist layer to form openings having a width not greater than the second thickness defining an upper photoresist pattern having upper portions, wherein the openings selectively expose portions of the lower photoresist layer;

selectively implanting silicon ions in the upper photoresist pattern using a directional implantation process to form a silylated layer only in the upper portions of the upper photoresist pattern;

simultaneously oxidizing the silylated layer using oxygen plasma and anisotropically ashing the portions of the lower photoresist layer exposed by the openings to form a lower photoresist pattern; and, etching the lower layer using the lower photoresist patterns as a mask.

7. The method of claim 6, wherein the directional implantation process is an oblique ion implantation process.

8. The method of claim 7, wherein a projection angle θ for the oblique ion implantation process is constrained by the relation arctan(max(w/t))<θ<2π;

wherein 'w' denotes a width of the openings in the upper photoresist pattern;

wherein 't' denotes a thickness of the upper photoresist pattern; and, max(w/t) being a maximum value for w/t taken across the openings.

9. The method of claim 6, wherein the silylated layer is etched together with the lower layer.

10. The method of claim 6, wherein the silicon ions introduced by the directional implantation process are obtained using silicon tetrafluoride $SiF_4$ gas.

11. The method of claim 6, wherein the upper photoresist layer is thinner than the lower photoresist layer.

12. The method of claim 6, wherein an inert gas or nitrogen plasma is added to the oxygen plasma used to oxidize the silylated layer.

13. The method of claim 6, wherein the silicon ions are introduced with a dosage of $1.0\times10^{15}$~$1.0\times10^{17}$ $Si/cm^2$.

14. The method of claim 6, further comprising removing the upper and lower photoresist patterns.

15. The method of claim 12, wherein the inert gas comprises argon or helium.

16. The method of claim 6, wherein the upper photoresist pattern is formed to a thickness of less than 0.4 μm and the lower photoresist pattern is formed to a thickness of at least 1 μm.

17. The method of claim 6, wherein patterning the upper photoresist layer comprises:

exposing the upper photoresist layer to light having a wavelength about 248 nm;

baking the upper photoresist layer at a temperature of about 100° C. for about 90 seconds; and, developing the upper photoresist layer using 2.38% tetramethylammonium hydroxide (TMAH).

* * * * *